United States Patent [19]

Faith, Jr.

[11] Patent Number: 4,536,223
[45] Date of Patent: Aug. 20, 1985

[54] METHOD OF LOWERING CONTACT RESISTANCE OF IMPLANTED CONTACT REGIONS

[75] Inventor: Thomas J. Faith, Jr., Lawrenceville, N.J.

[73] Assignee: RCA Corporation, Princeton, N.J.

[21] Appl. No.: 594,825

[22] Filed: Mar. 29, 1984

[51] Int. Cl.$^3$ .................................... H01L 21/265
[52] U.S. Cl. .................................... 148/1.5; 29/571; 29/576 B; 29/590
[58] Field of Search .................... 29/571, 576 B, 590; 148/1.5

[56] References Cited

U.S. PATENT DOCUMENTS

| 3,747,203 | 7/1973 | Shannon | 29/578 |
| 4,030,942 | 6/1977 | Keenan et al. | 148/1.5 |
| 4,084,311 | 4/1978 | Yasuoka et al. | 29/571 |
| 4,317,686 | 3/1982 | Anand et al. | 29/576 B |
| 4,385,938 | 5/1983 | Park et al. | 29/576 B |

OTHER PUBLICATIONS

Contact Resistance: Al and Al-Si to Diffused N+ and P+ Silicon, T. J. Faith et al., *Journal Vacuum Science Technology*, Al(2), Apr.-Jun. 1983, pp. 443-448.

Primary Examiner—Brian E. Hearn
Assistant Examiner—Hunter L. Auyang
Attorney, Agent, or Firm—Birgit E. Morris; Donald S. Cohen; Henry I. Steckler

[57] ABSTRACT

The resistance between a conductive contact and a region of relatively high conductivity in a body of semiconductor material is lowered by forming the high conductivity region by implanting ions of a desired conductivity type into the semiconductor body through a layer of a material which is electrically innocuous in the semiconductor body and is substantially oxygen free in the layer and at the interface between the layer and the semiconductor body. The layer is applied to the body by first removing any oxide from the surface of the body in an oxygen free ambient and immediately applying the layer to the body while maintaining the oxygen free ambient.

6 Claims, 5 Drawing Figures

METHOD OF LOWERING CONTACT RESISTANCE OF IMPLANTED CONTACT REGIONS

The present invention relates to a method of providing a contact having low resistance to a contact region in a semiconductor device, and more particularly to lowering the contact resistance of a contact region formed by ion implantation.

BACKGROUND OF THE INVENTION

Almost all semiconductor devices include at least one high conductivity contact region in the body of semiconductor material to which an ohmic contact is made. Such contact regions are generally formed by imbedding a high concentration of ions of a desired conductivity type into the semiconductor body. A technique for imbedding the ions into the semiconductor body which has come into general use is the well-known technique of ion implantation followed by an annealing, which activates the ions and removes any damage in the semiconductor body caused by the implantation. For certain types of semiconductor devices, such as MOS field effect transistors, the implantation of the ions is carried out through a thin layer of silicon oxide on the surface of the semiconductor body. However, even where there is no silicon oxide layer intentionally provided on the surface of the semiconductor body, there is generally at least a thin layer of oxide on the surface which is formed when the material of the semiconductor body is exposed to the oxygen in the ambient.

During the implantation process some of the oxygen atoms are knocked-out of their positions in the silicon oxide matrix by the high energy ions speeding through the oxide layer into the semiconductor body. Some of the oxygen "knock-on" atoms become imbedded in the semiconductor body. These "knock-on" atoms can cause damage to the semiconductor body and decreased implant activation during the implant annealing step, which can cause increased contact resistance to an overlying metal interconnect layer in the completed device.

In order to eliminate the oxygen knock-on atoms it would appear that all that would be needed would be to eliminate the oxide layer and implant directly into the surface of the semiconductor body. However, as stated above, silicon, the major semiconductor material used, readily oxidizes when exposed to the oyxgen in the ambient resulting in a thin layer, of about 30 angstroms thick, of native oxide. It is believed that most of the oxygen knock-on atoms which end up in the semiconductor body come from regions only a few atomic layers from the silicon oxide-silicon interface. Thus, even a thin native oxide layer provides an oxygen source for knock-on into the semiconductor body which is equivalent to a layer of silicon oxide 300 to 500 angstroms in thickness.

One possible way of eliminating oxygen knock-ons would be to use a layer of a material which contains little or no oxygen and which itself would be electrically innocuous if it was knocked-on into the semiconductor body. For a silicon semiconductor body, amorphous or polycrystalline silicon would meet this criteria. However, whatever material is used, it must be removed, wholly or partially, to permit the contact material to be applied directly to the surface of the contact region in the semiconductor body. Thus, using the same material as the semiconductor body is not completely acceptable since it would be difficult to selectively remove.

Another material which has been suggested for this purpose in U.S. Pat. No. 4,030,942 to W. A. Keenan et al., issued June 21, 1977 entitled "Semiconductor Masking For Device Fabrication Utilizing Ion Implanatation And Other Methods", is aluminum nitride which is deposited on the semiconductor body by a chemical vapor deposition process. However, when using such a process the semiconductor body will probably be exposed to the ambient while placing it in the deposition apparatus. As previously stated this will result in a thin layer of native oxide being formed on the surface of the semiconductor body which provides sufficient knock-on oxygen atoms to cause problems. Therefore, it is desirable to have a method by which a layer of a material having little or no oxygen therein and which is innocuous in the material of the semiconductor body can be applied to the semiconductor body so as to permit ion implantation without the adverse effects of oxygen knock-on.

SUMMARY OF THE INVENTION

A method of making a low resistance contact to a body of semiconductor material includes the steps of removing any oxide from the surface of the semiconductor body and immediately depositing on said surface without exposing the surface to any oxygen a layer of a material which is substantially free of oxygen and which is innocuous in the material of the semiconductor body. Ions of a desired conductivity type are then implanted into the semiconductor body through said layer to form a region of relatively high conductivity in the body. The body is then annealed to activate the implanted ions.

DETAILED DESCRIPTION OF PREFERRED EMBODIMENT

Figure 1:
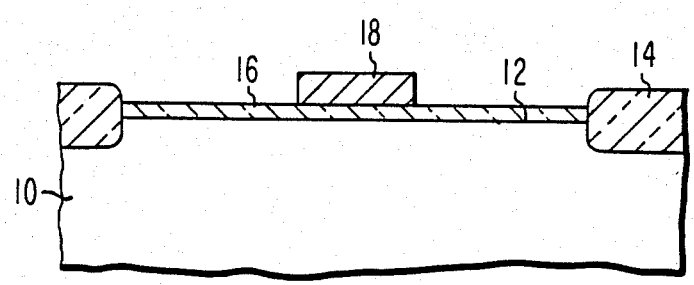
FIGS. 1-4 are sectional views illustrating the steps of a method for making a semiconductor device using the present invention.

In general, the present invention provides on the surface of a substrate of semiconductor material into which ions of a desired conductivity type are to be implanted a layer of material which has the following characteristics:

1. It contains little or no oxygen.
2. It is electrically innocuous in the semiconductor material so that if its atoms are knocked-on into the semiconductor material they will have minimal adverse effect on the electrical characteristics of the implanted portion of the semiconductor body. 3. It can be readily selectively removed from the semiconductor body.
4. It can be applied to the body by a process which can be carried out immediately after the surface of the body is cleaned of any oxide without exposing the surface to oxygen so that no native oxide is formed on the surface of the body just prior to or during its application.

I have found that one material which meets all of the above requirements and is therefore highly suitable for use in the present invention is aluminum.

FIGS. 1–4 illustrate one method of making a semiconductor device, an MOS field effect transistor, using the present invention. A substrate 10 of a semiconductor material such as single crystalline silicon, having a major surface 12 is partially covered with a thick layer 14 of silicon oxide, which serves as a field oxide. The field oxide layer 14 may be formed by providing a masking layer over the portion of the surface 12 where the field effect transistor is to be formed and oxidizing the uncovered portion of the surface 12 by exposing it to steam at 900° C. or above. After the masking layer is removed a thin layer 16 of silicon oxide, which serves as the gate oxide of the field effect transistor, is formed on the portion of the surface 12 not covered by the field oxide layer 14. The gate oxide layer 16 may be formed by exposing the surface 12 to a mixture of wet oxygen and hydrogen chloride at a temperature of about 800° C. A gate 18 of a conductive material, such as a metal or conductive polycrystalline silicon, is formed on a portion of the gate oxide layer 16. The gate 18 may be formed by depositing the material thereof over the entire surface of the gate oxide 16 and field oxide 14 and then defining the layer to form the gate using standard photolithographic techniques. The portions of the gate oxide layer 16 on each side of the gate 18 are then removed by chemical etching, plasma etching or reactive ion etching. When removing the exposed portions of the gate oxide layer 16 a suitable masking layer may be provided over the field oxide layer 14 and the gate 18.

Figure 2:
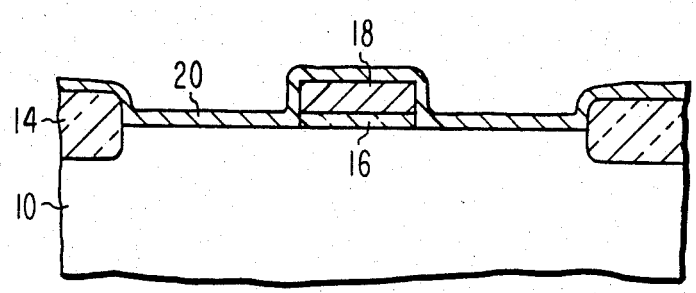

The portion of the substrate surface 12 exposed after removing the gate oxide layer 16 is then thoroughly cleaned of any oxide and, without exposing the clean surface to any oxygen, a layer 20 of the material previously described, such as aluminum, is immediately deposited over the clean substrate surface 12 as shown in FIG. 2. The layer 20 is also deposited over the gate 18 and the field oxide 14. The cleaning of the substrate surface 12 and the deposition of the layer 20 may be carried out by placing the substrate 10 in a chamber which is then evacuated to remove all oxygen. The substrate surface 12 can then be cleaned by the well-known technique of reactive ion etching or plasma etching. Without breaking the vacuum in the chamber, the layer 20 may be desposited by the well-known technique of evaporation of the material in a vacuum. When depositing aluminum, it should be deposited at a high rate to assure a low oxygen concentration in the aluminum film. Thus, the layer 20, which contains little or no oxygen, is deposited on an oxide free surface of the substrate 10. Although an aluminum layer 20 will form a thin native oxide on its surface when exposed to the atmosphere, the layer 20 is thick enough so that few, if any, of the oxygen atoms from the surface oxide layer will be knocked-on into the underlying semiconductor body.

Figure 3:
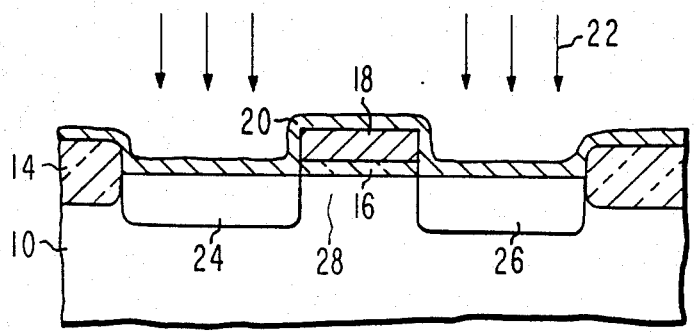

As indicated in FIG. 3 by the arrows 22, ions of a conductivity type opposite to that of the semiconductor body 10 are then implanted through the layer 20 into the semiconductor body 10 at each side of the gate 18. This forms the source and drain regions 24 and 26 respectively of the field effect transistor which are spaced apart by a channel region 28 directly beneath the gate 18. The concentration of ions implanted in the source and drain 24 and 26 are such that the source and drain regions are of relatively high conductivity. The layer 20 is then removed with a selective etching technique which will remove the material of the layer 20 without adversely affecting the semiconductor body 12, field oxide 14 or gate 18. For a layer 20 of aluminum the selective etching technique can be a wet etch, such as a mixture of water, nitric, phosphoric and acetic acids.

Figure 4:
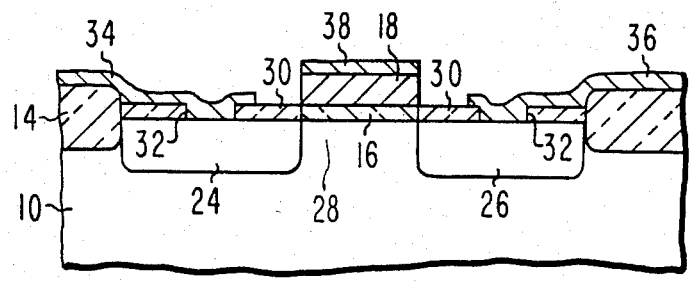

Removing the layer 20 reexposes the portions of the surface 12 directly over the source and drain regions 24 and 26. As shown in FIG. 4, a thin layer 30 of silicon oxide can then be formed on the surface 12 over the source and drain regions 24 and 26, such as by heating the substrate 10 in an oxidizing ambient. The substrate 10 can then be heated to an annealing temperature, 850°–1000° C., which activates the implanted ions in the source and drain regions 24 and 26, and anneals out any defects in the semiconductor body 10 caused by the ion implantation. Openings 32 can then be formed in the silicon oxide layer 30 to the source and drain regions 24 and 26. Metal contacts 34 and 36 can then be formed over the silicon oxide layers 30 and into the openings 32 to contact the source and drain regions 24 and 26 respectively. A metal contact 38 can also be formed on the gate 18. The substrate 10 can then be heated to an alloying temperature, 400° to 450° C., which alloys the contacts 34 and 36 to the source and drain regions 24 and 26 to provide good ohmic contacts therebetween.

Figure 5:
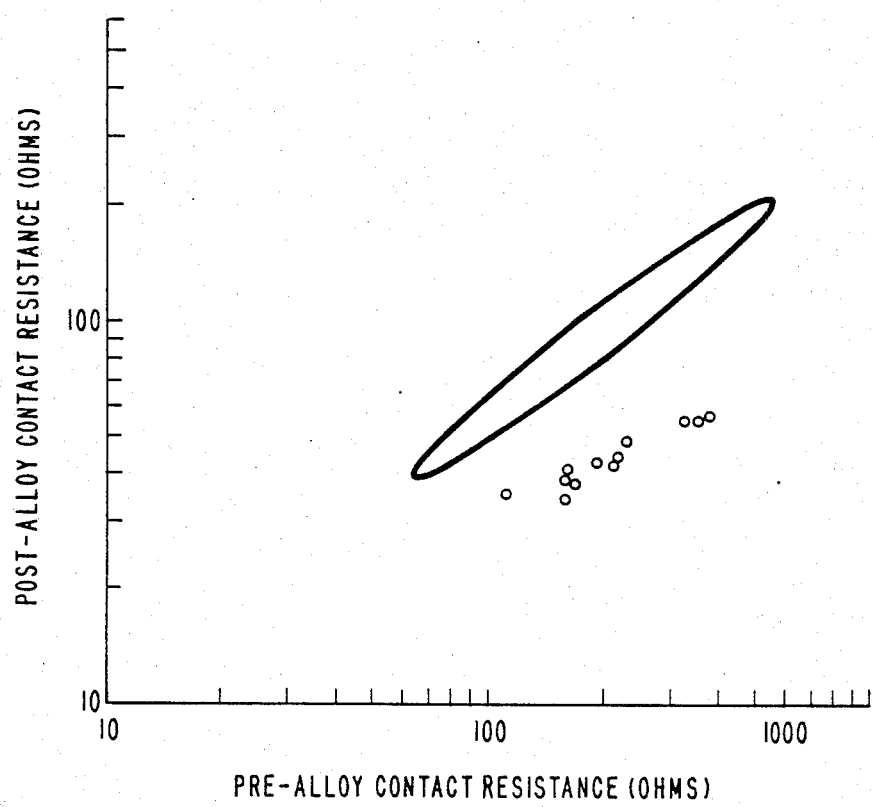
FIG. 5 is a graph comparing the contact resistances achieved using the present method with those achieved by implanting through an oxide layer.

To determine the effectiveness of the oxygen knock-on free layer of the present invention, an experiment was carried out in which the variables were the thickness and composition of the layer through which implanted phosphorous ions traversed to dope a substrate of single crystalline silicon. Six wafers of single crystalline silicon were provided with the contact-resistance-measurement test structure described in the article of T. J. Faith et al. entitled "Contact Resistance: Al and Al-Si to diffused N+ and P+ silicon", *Journal Vacuum Science Technology*, Al (2), April–June 1983, pp. 443–448. Each of the wafers was provided with a highly doped channel region, a layer of silicon dioxide was formed over the channel region, and three openings, each 3 micrometers square, were formed in the silicon oxide layer spaced along the channel region, and separate contact strips were formed over the silicon oxide layer and through the openings to contact the channel region. The channel region in each of the wafers was formed by implanting phosphorous ions into the wafer. In one of the wafers the implantation was carried out into the "bare" surface of the wafer which had a native oxide layer of about 30 angstroms thereon. In four of the wafers the implantation was carried out through layers of silicon oxide of various thicknesses, 200 angstroms, 350 angstroms, 470 angstroms and 530 angstroms respectively. In the sixth wafer the implantation was carried out through a layer of aluminum of about 300 angstroms. The aluminum layer was applied to the wafer by first removing the native oxide from the surface of the wafer by hydrogenplasma etch immediately followed by the flash evaporation of aluminum at a high deposition rate, about 100 angstroms per second. For each of the wafers the contact resistance between each contact and the channel region was measured using the technique described in the above article immediately after the contacts were formed. The wafers were then heated for 30 minutes at 425° C. in forming gas to alloy the contacts and the wafers and the contact resistances were measured again. FIG. 5 is a graph showing the contact resistance after alloying versus the contact resistance before alloying for the 72 contacts measured. Because of the high density of the data points for the five wafers implanted through silicon oxide, the bounds of the data are shown as an envelope rather than showing all 60 data points. The data points for the wafer implanted through aluminum are displayed individually. It can be seen from this graph that the data points for the wafer implanted through the aluminum layer lie almost a factor of two below the envelope enclosing the data points for the wafers implanted through silicon oxide. This shows that the contacts with the oxygen knock-on free implants alloy more effectively than contacts implanted through the oxides. Also, the data points for the wafer in which the implantation was into the "bare surface" fall into the same area as those for wafers in which the implantation was through a thicker oxide layer. This shows that a thin native oxide layer provides a source of knock-on oxygen atoms into the substrate comparable to that provided by the thicker oxide layers.

We claim:

1. A method of making a low resistance contact to a body of semiconductor material which includes the step of removing any oxide from at least a portion of a surface of a body of semiconductor material while said body is in a chamber from which substantially all oxygen is removed, immediately depositing on said surface without exposing the surface to oxygen a layer of aluminum which is substantially free of oxygen and which is electrically innocuous in the material of the semiconductor body while said body is maintained in said oxygen free chamber, then implanting into the semiconductor body through said layer ions of a desired conductivity type to form in said body a region of relatively high conductivity, and then annealing said body to activate said ions.

2. A method in accordance with claim 1 in which after the ions are implanted into the semiconductor body the layer is removed from the body.

3. A method in accordance with claim 2 in which after the layer is removed from the semiconductor body a conductive contact is applied to the surface of the body over the region of high conductivity.

4. A method in accordance with claim 3 in which the contact is alloyed after the conductive contact is applied to the body.

5. A method in accordance with claim 1 in which the oxide is removed by plasma etching or reactive ion sputtering and the layers applied by evaporation in a vacuum.

6. A method in accordance with claim 5 in which the aluminum is deposited at a fast rate so as to be relatively oxygen free.

* * * * *